United States Patent [19]

Eder et al.

[11] Patent Number: 5,307,555
[45] Date of Patent: May 3, 1994

[54] PART PITCH INDEPENDENT ELECTRICAL COMPONENT FEEDER

[75] Inventors: Scott T. Eder, Norristown, Pa.; Gerald M. Lepley, Delaware; Glenn J. Kahle, Plain City, both of Ohio

[73] Assignee: Ford Motor Company, Dearborn, Mich.

[21] Appl. No.: 16,934

[22] Filed: Feb. 12, 1993

[51] Int. Cl.$^5$ .................. B23P 23/00; B21F 45/00; H05K 13/00

[52] U.S. Cl. .................. 29/566.3; 29/564.6; 29/835; 140/105

[58] Field of Search ........... 29/564.6, 566.3, 33 M, 29/566.1, 566.2, 741, 835, 827; 140/105, 147

[56] References Cited

U.S. PATENT DOCUMENTS

| | | | |
|---|---|---|---|
| 4,029,131 | 6/1977 | Zemek et al. | 140/105 |
| 4,488,581 | 12/1984 | Stumpf et al. | 140/147 |
| 4,619,042 | 10/1986 | Halstead | 29/837 |
| 4,621,419 | 11/1986 | Hino et al. | 29/837 |
| 4,756,081 | 7/1988 | Penn | 29/832 |
| 4,757,600 | 7/1988 | Holcomb | 29/566.3 |
| 4,817,266 | 4/1989 | Holcomb | 29/566.3 |
| 4,877,174 | 10/1989 | Bruhn | 29/835 |
| 4,910,859 | 3/1990 | Holcomb | 29/564.2 |
| 4,939,942 | 7/1990 | Thome et al. | 73/865.9 |
| 5,019,209 | 5/1991 | Hiraide et al. | 29/827 X |

FOREIGN PATENT DOCUMENTS

| | | | |
|---|---|---|---|
| 46334 | 2/1982 | European Pat. Off. | 29/564.6 |
| 61-158165 | 7/1986 | Japan . | |
| 305600 | 12/1989 | Japan | 29/564.6 |

*Primary Examiner*—William Briggs
*Attorney, Agent, or Firm*—Roger L. May; Raymond L. Coppiellie

[57] ABSTRACT

An apparatus for forming the leads of electrical components such as five-leaded TO-220 packages is provided. Taped components are supplied from a reel to a sensor which detects the presence of an electrical component contained on the tape, and stops advancement of the tape. While the tape is stopped, a cutter singulates a segment of tape having at least one electrical component from the remainder of the tape. The singulated tape is then advanced through a lead forming station, where the leads of the electrical component are formed into the desired configuration. A method is also disclosed for forming the leads of electrical components supplied on a roll of tape.

12 Claims, 3 Drawing Sheets

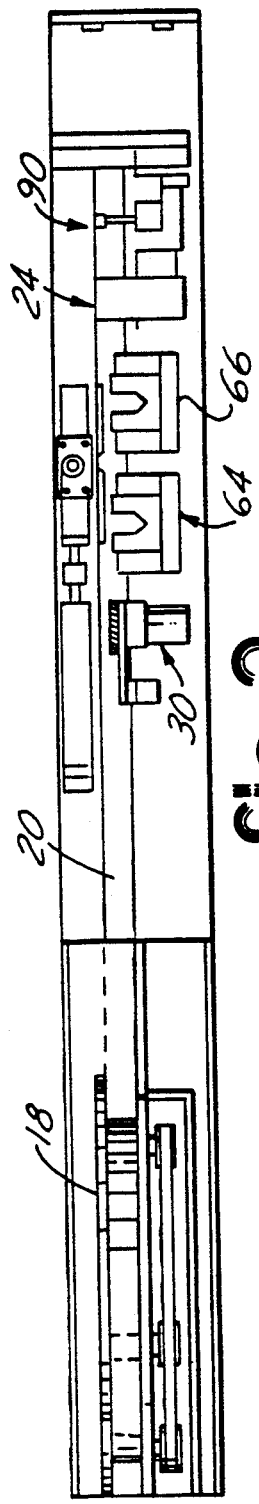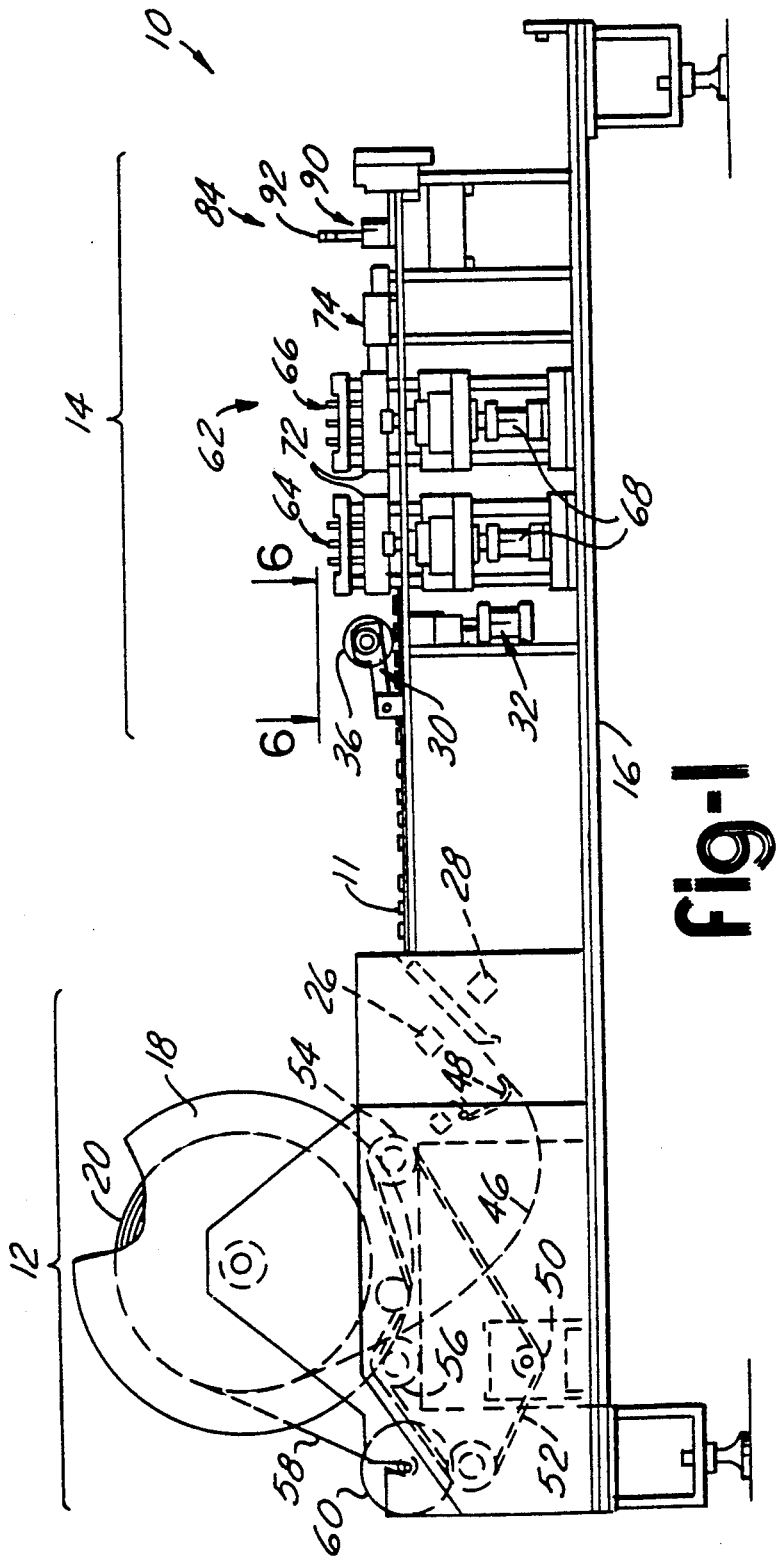

PART PITCH INDEPENDENT ELECTRICAL COMPONENT FEEDER

TECHNICAL FIELD

This invention relates to apparatus for forming the leads of electrical components supplied on a tape and, more particularly, to such an apparatus which operates independently of the spacing between adjacent electrical components.

BACKGROUND ART

Power transistors such as five-leaded TO-220 packages are commonly used in many electronic devices and modules. During operation, the TO-220 packages generate a great deal of heat which is normally dissipated through a metal header built into the TO-220 package. However, radiant heat transfer alone may not be sufficient to avoid damage to the electronic internals of the power transistor. In such cases, it is desirable to conduct heat away from the transistor and to a heat sink. However, the metal header built into the TO-220 package is at an operating voltage, so the header must be insulated before coming into contact with a grounded metallic heat sink.

One method of insulating the TO-220 headers is to apply a silicon-based tape which acts as both an electrical insulator and a facilitator of heat transfer. Prior to delivery to a lead cutting and forming machine, such as that disclosed in U.S. Pat. No. 4,757,600 to Holcomb, the TO-220 packages are, therefore, typically adhered to one side of the tape. The tape is then wound onto a reel, which can be unwound to supply parts to the cutting and forming machine.

The transistor packages can be joined to the tape either manually or automatically. However, neither method of depositing the packages on the insulating tape reliably maintains a regular spacing, or pitch, between adjacent packages. Furthermore, the tape which holds the components is not usually separated into individual segments by the machine until after the lead cutting and forming operations have been performed. Because the lead cutting and forming operations are performed at regular intervals, these machines require the parts on the tape to be at a well known distance from each other. Such machines are, therefore, dependent on the pitch between adjacent parts. If the variance of the part pitch is outside narrow tolerances, the die presses which normally perform the cutting and forming operations do not strike the components correctly. The die presses may then become jammed or misaligned, and the resulting misformed parts must be scrapped.

SUMMARY OF THE INVENTION

The present invention is an apparatus for forming the leads of electrical components such as power transistors in a TO-220 package, and comprises a sensor, a cutter, and a lead forming station. Taped components are supplied from a reel to the sensor which detects the presence of an electrical component contained on the tape, and stops advancement of the tape. While the tape is stopped, the cutter separates or singulates a segment of tape having an electrical component from the remainder of the tape. The singulated tape is then advanced through the lead forming station, where the leads of the electrical component are formed into the desired configuration. The part advance mechanism of the present invention is thus active until an actual part is sensed by the sensor, which eliminates the dependence on a perfect pitch between the electrical components because any slight variation in pitch will merely cause the drive motor to operate for a slightly different amount of time.

The invention also includes a method of forming the leads of electrical components supplied on a roll of tape. The method comprises detecting the presence of an electrical component, singulating a segment of tape having an electrical component from the remainder of the tape after detecting the presence of an electrical component, and forming the leads of the electrical component contained on the segment into a desired configuration.

Accordingly, it is an object of the present invention to provide an apparatus of the type described above which singulates the tape and the electrical component thereon from the remainder of the tape prior to the die press operation.

Another object of the present invention is to provide an apparatus of the type described above which uses a sensor to detect the entrance of an electrical component into a feeder section of the apparatus and stop the advance of the component for singulation from the remainder of the tape.

Still another object of the present invention is to provide an apparatus of the type described above which has fault detection features for identifying and rejecting any misformed component.

These and other objects, features, and advantages of the present invention are readily apparent from the following detailed description of the best mode for carrying out the invention when taken in conjunction with the accompanying drawings.

FIG. 1 is a side view of an apparatus according to the present invention for forming the leads of electrical components;

FIG. 2 is a top view of the apparatus shown in FIG. 1;

BEST MODE FOR CARRYING OUT THE INVENTION

Figure 3:
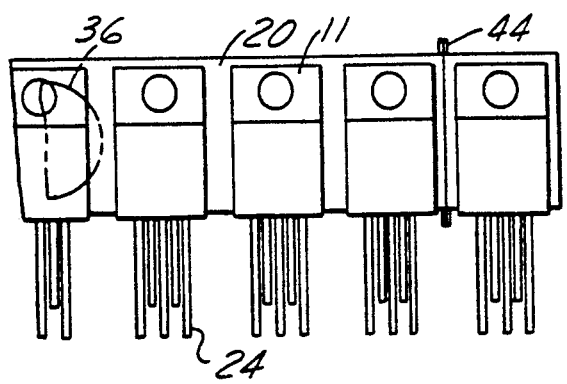
FIG. 3 is a top view of a tape containing the electrical components being fed past a singulating station of the apparatus.
Figure 4:
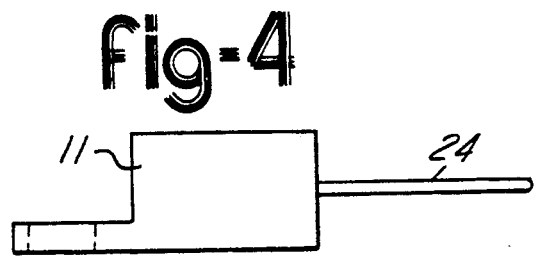
FIG. 4 is a side view of a five-leaded TO-220 package.
Figure 5:
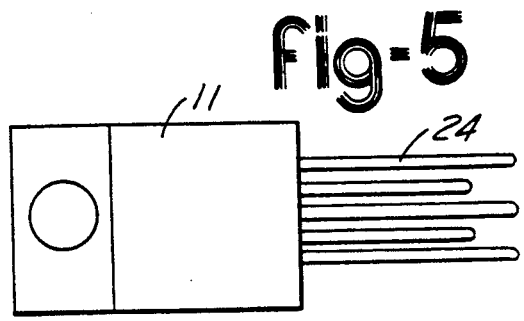
FIG. 5 is a top view of the TO-220 package.

With reference to the drawings, the preferred embodiments of the present invention will be described. FIGS. 1 through 3 show an apparatus 10 according to the present invention for forming the leads of electrical components 11 such as five-leaded TO-220 solid state packages or transistors shown in FIGS. 4 and 5. The apparatus 10 includes a de-reeler section 12 and a feeder section 14 both mounted on a feeder base 16.

The de-reeler section 12 includes a supply reel 18 of insulative tape or sil-pad 20 to which a plurality of electrical components 11 having precut leads 24 are adhered in single file. The electrical components 11 are normally secured to the sil-pad at a specified distance, or part pitch, from each other. The tape 20 from the reel 18 is fed through a pair of throughbeam sensors 26 and 28, which check to insure that tape is passing thereby, to the feeder section 14. As components are required for processing, a friction drive 30 at the beginning of the feeder section 14 presents components to a cutter 32.

Figure 6:
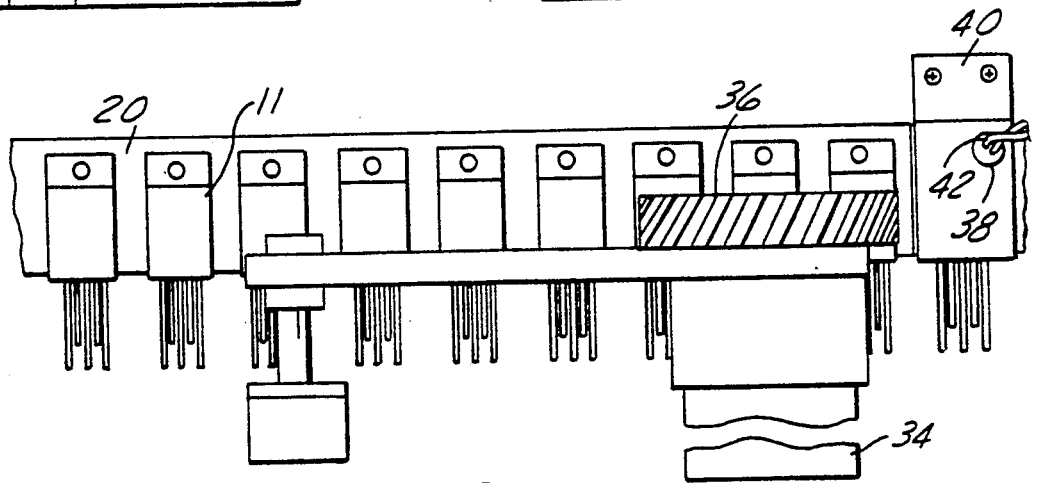
FIG. 6 is an enlarged view taken along line 6—6 in FIG. 1.
Figure 7:
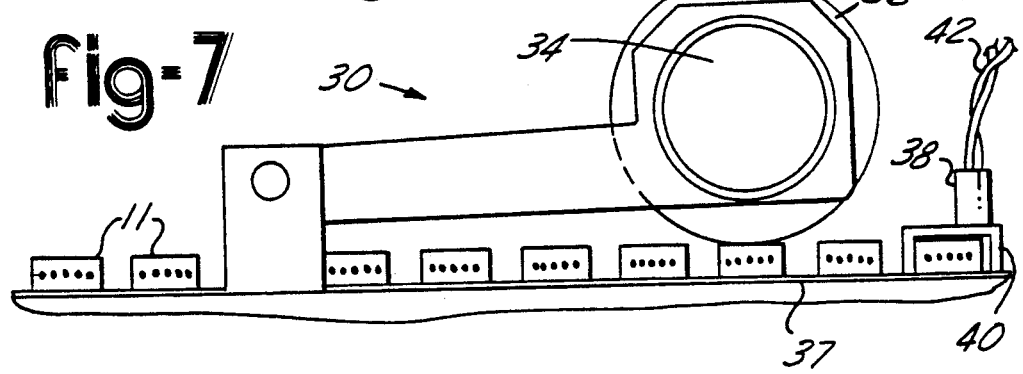
FIG. 7 is a side view of a friction drive of the apparatus.

As shown in FIGS. 6 and 7, the friction drive 30 includes a motor 34 which turns a rubber drive wheel 36. The drive wheel 36 frictionally engages the tops of the electrical components 11 to draw the tape 20 along a Teflon TM impregnated low friction surface 37 and into the feeder section 14. A retro-reflective photo optic sensor 38 is mounted on a bracket 40, and has fiber optic cables 42 which allow the sensor to generate a beam of light downwardly toward the tape and detect its return.

The sensor 38 scans the tape 20 as the tape advances through the friction drive 30, and functions to detect the presence of an electrical component 11 contained on the tape. Upon detecting the presence of an electrical component 11 in the proper position, the sensor 38 generates a signal to temporarily turn off the motor 34.

Figure 8:
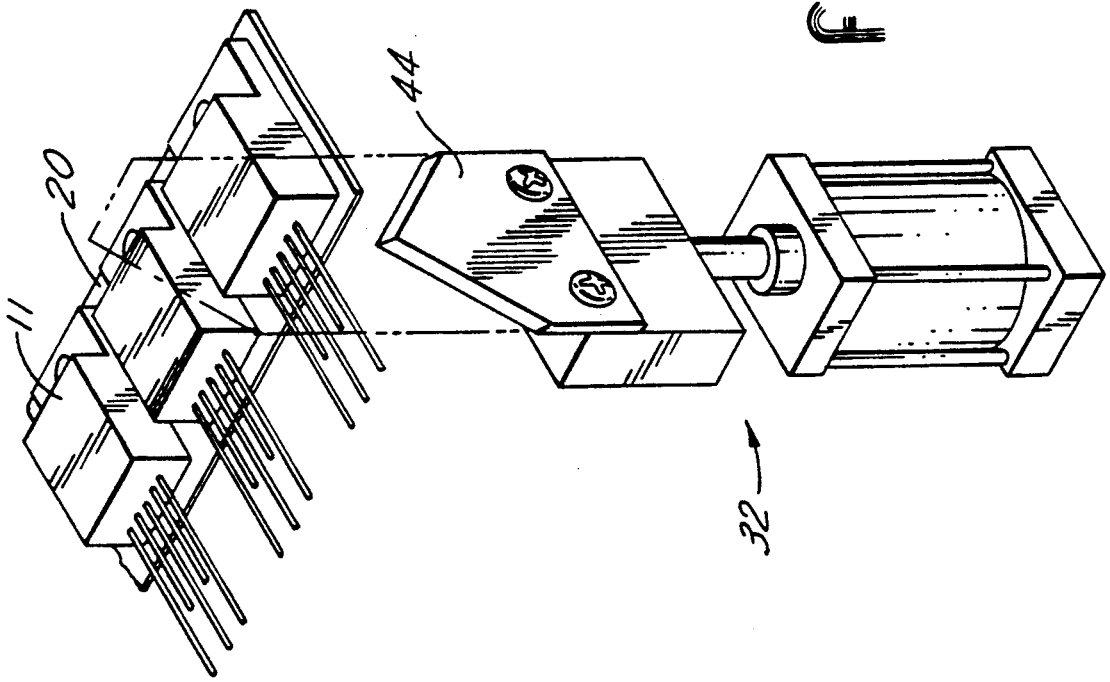
FIG. 8 is a perspective view of a cutter of the apparatus.

When the advancement of the tape is momentarily interrupted, a conventional walking beam mechanism having a series of hitch-feed plates (not shown) lowers to securely hold the electrical component 11 on the track machined into the surface 37. As shown in FIG. 8, a spade-shaped blade 44 of the cutter 32 then swings upwardly from below the tape 20 to the position shown in phantom to separate or singulate a segment of the tape having at least one electrical component from the remainder of the tape. Thus, the part advance mechanism of the present invention is active until an actual part is sensed by the sensor 38. This eliminates the dependence on a perfect pitch between the electrical components because any slight variation in pitch will merely cause the drive motor 34 to operate for a slightly different amount of time.

Referring again to FIG. 1, as the drive wheel 36 feeds parts to the cutter 32, slack in a section 46 of the tape extending between the storage roll 18 and the cutter is reduced. As the tape grows taut, a paddle 48 engaged with the section 46 is moved from a more vertical orientation to a more horizontal orientation. Upon reaching a predetermined position, the paddle 48 trips a sensor or otherwise activates an electrical motor 50.

The motor 50 is drivingly connected through a belt or chain 52 and drive pulleys 54 and 56 to the reel 18, and actively unwinds the reel to maintain slack in the section 46 generally constant. When sufficient slack is reintroduced into the section 46, the paddle 48 swings back past another predetermined point to signal the motor 50 to cease driving the reel 18. Of course, any sensing means for detecting slack in the section 46 other than the paddle 48 engaged therewith is acceptable. At the same time the tape 20 containing the electrical components 11 is unwound from the reel 18, a mylar interleave 58 often placed between the coiled layers of tape may be collected on a take up reel 60.

After singulation at the cutter 32, the electrical component 11 remains attached to the singulated segment of tape. The individual segments of tape are then indexed to a lead forming station 62 and the subsequent stations along the rest of the line one station at a time. The lead forming station 62 preferably includes a pair of pneumatically operated die presses 64 and 66. Each of the presses operates to bend and/or cut a predetermined number of leads on the electrical components passing therethrough. When processing a five-leaded TO-220 package, for example, air cylinders 68 forces the bottom halves 70 of two forming plates of the respective presses into the corresponding top halves 72. The first die press 64 bends two of the five leads using staggered plates to obtain two bends. The second die press 66 bends the remaining three leads using slightly smaller staggered plates to obtain two shorter bends, as shown generally in FIG. 9.

Figure 9:
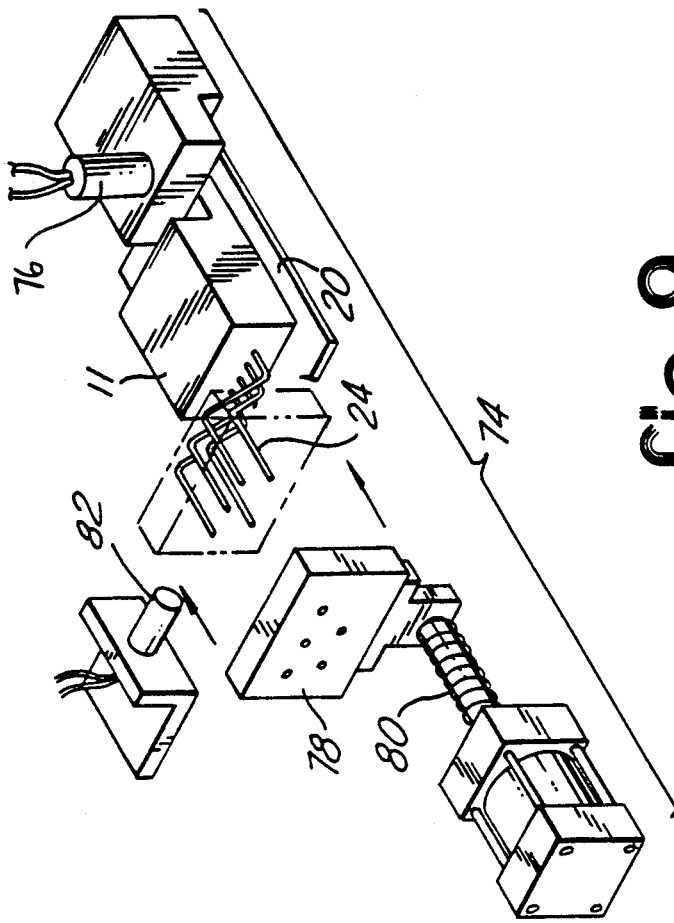
FIG. 9 is a perspective view of an inspection station of the apparatus.

The electrical component 11 is then moved from the lead forming station 62 to an inspection station 74. As shown in FIG. 9, the inspection station 74 comprises a retro-reflective photo optic sensor 76 to check that the proper amount of insulative tape is still attached to the component 11, and a steel gauge plate 78 having a hole pattern which matches the desired lead configuration. The gauge plate 78 is lightly loaded by a spring 80 to be insertable over the formed leads 24 to verify that they are properly configured. If the gauge plate 78 encounters resistance which impedes its insertion to the position shown in phantom, the gauge plate will not be sensed to be in the correct position by a proximity sensor 82. The absence of a signal from the proximity sensor 82 creates an error condition identifying a part to be rejected. The rejected part is then tripped off the assembly line by a blast of air at a blow off station 84 shown in FIG. 1.

If the leads 24 fit correctly into the alignment holes on the gauge plate 78, the electrical component 11 is deemed acceptable, and is passed to a part presentation station 90. At the part presentation station, a gripper 92 takes the component and puts it into the desired module or circuit board assembly.

The present invention also includes a method of forming the leads of electrical components supplied on a roll of tape in accordance with the apparatus described above. The method comprising detecting the presence of an electrical component at a given location, and then singulating a segment of tape having at least one electrical component from the remainder of the tape after detecting the presence of an electrical component. The leads of the electrical component contained on the segment are then formed into a desired configuration. The method further comprises measuring slack in the tape between the roll and the given location, and advancing the roll in response to the amount of slack. Preferably, the advancement of the tape is interrupted prior to the singulating step.

It should be understood that while the forms of the invention herein shown and described constitute preferred embodiments of the invention, they are not intended to illustrate all possible forms thereof. It should also be understood that the words used are words of description rather than limitation, and various changes may be made without departing from the spirit and scope of the invention disclosed.

We claim:

1. Apparatus for forming the leads of electrical components contained on a tape, the apparatus comprising:
    a sensor for detecting the presence of an electrical component contained on the tape;
    means for singulating a segment of tape having at least one electrical component from the remainder of the tape after the sensor detects the presence of an electrical component;
    a lead forming station adapted to accept the segment of tape and to form the leads of the electrical component contained on the segment into a desired configuration;

the tape being stored in a reel prior to delivery to the sensor, the tape having a section extending from the reel to the sensor;

a motor drivingly connected to the reel to maintain slack in the section generally constant; and means for detecting slack in the section, the means for detecting slack in the section comprising a paddle engaged with the section and movable as the slack in the section varies, the paddle activating the motor upon moving to a predetermined position.

2. Apparatus for forming the leads of electrical components, the apparatus comprising:

a reel of tape having a plurality of electrical components adhered thereto, the tape having a section extending to a retro-reflective sensor adapted to detect the presence of an electrical component contained on the tape;

a motor drivingly connected to the reel;

a paddle engaged with the section and movable as slack in the section varies, the paddle activating the motor upon moving to a predetermined position;

a cutter for singulating a segment of tape having at least one electrical component from the remainder of the tape after the sensor detects the presence of an electrical component;

a pneumatically operated die set adapted to accept the segment of tape and to form the leads of the electrical component contained on the segment into a desired configuration; and a gauge plate adapted to accept the electrical component from the die set and to verify the configuration of the leads.

3. Apparatus for forming the leads of electrical components contained on a tape, the apparatus comprising:

a sensor for detecting the presence of an electrical component contained on the tape;

means for singulating a segment of tape having at least one electrical component from the remainder of the tape after the sensor detects the presence of an electrical component;

a lead forming station adapted to accept the segment of tape and to form the leads of the electrical component contained on the segment into a desired configuration;

an inspection station adapted to accept the electrical component from the lead forming station and to verify the configuration of the leads, the inspection station comprising a plate having a hole pattern matching the desired configuration of the electrical component leads.

4. The apparatus of claim 1 further comprising an inspection station adapted to accept the electrical component from the lead forming station and to verify the configuration of the leads.

5. The apparatus of claim 4 wherein the inspection station comprises a plate having a hole pattern matching the desired configuration of the electrical component leads.

6. The apparatus of claim 1 wherein the sensor comprises a retro-reflective sensor.

7. The apparatus of claim 1 wherein the sensor generates a signal upon detecting the presence of an electrical component to momentarily interrupt advancement of the tape.

8. The apparatus of claim 7 wherein the means for singulating a segment of tape operates when the advancement of the tape is interrupted.

9. The apparatus of claim 1 wherein the tape contains an adhesive to which the electrical components adhere.

10. The apparatus of claim 1 wherein the lead forming station comprises a first die set and a second die set.

11. The apparatus of claim 10 wherein the first and second die sets are pneumatically operable.

12. The apparatus of claim 1 wherein the electrical components comprise TO-220 packages.

* * * * *